(12) United States Patent
Sugiyama et al.

(10) Patent No.: US 7,928,981 B2
(45) Date of Patent: Apr. 19, 2011

(54) SIGNAL GENERATOR DISPLAY INTERFACE FOR INSTINCTIVE OPERATION OF EDITING WAVEFORM PARAMETERS

(75) Inventors: Toshio Sugiyama, Shizuoka (JP); Susan C. Adam, Portland, OR (US); Hiroshi Komatsu, Tokyo (JP); Kazumasa Ito, Sizuoka (JP); Takayuki Hayase, Saitama (JP); Toru Takai, Tokyo (JP)

(73) Assignee: Tektronix International Sales GmbH, Rheinfall (CH)

( * ) Notice: Subject to any disclaimer, the term of this patent is extended or adjusted under 35 U.S.C. 154(b) by 660 days.

(21) Appl. No.: 11/407,635

(22) Filed: Apr. 20, 2006

(65) Prior Publication Data

US 2006/0250530 A1    Nov. 9, 2006

(30) Foreign Application Priority Data

Apr. 22, 2005 (JP) .................................. 2005-125031

(51) Int. Cl.
*G06T 11/20* (2006.01)
(52) U.S. Cl. ........................................................ 345/440
(58) Field of Classification Search .................... 345/440
See application file for complete search history.

(56) References Cited

U.S. PATENT DOCUMENTS

| 5,475,851 | A  | * | 12/1995 | Kodosky et al. | ............... 715/763 |
| 6,320,577 | B1 | * | 11/2001 | Alexander | .................. 345/440.1 |
| 6,515,484 | B1 | * | 2/2003  | Bald et al. | ...................... 324/551 |
| 2003/0169257 | A1 | * | 9/2003 | Alexander et al. | ............. 345/440 |
| 2004/0001079 | A1 | * | 1/2004 | Zhao et al. | ..................... 345/719 |
| 2004/0095350 | A1 | * | 5/2004 | Kamiyama | .................... 345/441 |

OTHER PUBLICATIONS

Bai et al.; "A Windows-Based Dual-Channel Arbitrary Signal Generator," IEEE Instrumentation and Measurement Technology Conference, Anchorage, AK, May 21-23, 2002.*
Hioki 7075 Waveform Generator, represented by the instrument's specification, Hioki E. E. Corporation (7075E2-62B-00K, updated Oct. 29, 1999).*

* cited by examiner

*Primary Examiner* — Xiao M. Wu
*Assistant Examiner* — Edward Martello
(74) *Attorney, Agent, or Firm* — William K. Bucher

(57) ABSTRACT

Instinctive operation of editing parameters of waveform is provided. Tabs 38, 40 and 42 are displayed on a display screen 14 to show existence of parameter edit screen layers of different combinations of characters, waveforms and channels. If one of the tabs are selected the display is switched to show the corresponding parameter edit screen layer. Channel characters or waveforms are displayed on the tabs 38, 40 and 42 and are changed dynamically according to the setting so that a user can easily realize setting outlines of the respective channels at a glance.

18 Claims, 7 Drawing Sheets

SIGNAL GENERATOR DISPLAY INTERFACE FOR INSTINCTIVE OPERATION OF EDITING WAVEFORM PARAMETERS

BACKGROUND OF THE INVENTION

The present invention relates generally to display interfaces for signal generators and more particularly to a signal generator display interface having parameter edit screen layers having improved parameter edit screen displays of text, waveforms and channels for selecting desired combinations of parameters for the generation of output signals.

Signal generators are used for providing electrical signals having user defined characteristics to electronic circuits under test to verify the performance of the circuits, FIG. 1 shows a schematic block diagram of a signal generator 8. A CPU (central processing unit) 10 controls the operation of the various components of the signal generator 8 via a system bus 22. A memory 12 that includes ROM and RAM memory, a hard disk drive and the like stores executable programs for controlling the functions of the signal generator 8 as well as output waveform data. The signal generator displays basic waveform data (waveforms of sine, pulse, etc.) on a display 14 and has a user interface (operation keys, etc.) 16 for changing parameters (frequency, voltage, etc.) of the waveform data. A user edits the waveform data, which may represent waveforms for separate output signal channels using the interface 16. The edited waveform data is stored in memory 12. The edited waveform data in the memory 12, which may contain more than one waveform data file, is transferred to digital to analog converters (DACs) 18 and 20. The DACs 18 and 20 convert the waveform data files into analog output signals. The DACs are provided according to the number of desired channels. A signal generator as described above is disclosed in U.S. Pat. No. 5,371,315, for example.

One method of changing the parameters of the output waveform data is for a user to directly inputs numerical parameter values through the interface 16. Another method is displaying the waveform or waveforms on the display screen 14 and allowing the user to modify the shape of the waveform or waveforms. If the signal generator has two output channels and it is necessary to consider the phase relationship between the waveforms output to each channel, it is easier to edit the waveforms parameters through the displayed waveforms than editing only the numerical values. Even if the waveform or waveforms can be set by the numerical values, it would be helpful for the user to display the waveforms because it enables the user to confirm them visually. It is, therefore, preferable to display the waveforms on the screen for editing parameters as well as the characters and numbers of the channels.

Operability of the signal generator would be improved if the signal generator displays characters, numbers, waveforms and channels for editing waveform parameters by rearranging the waveform parameter data and channels combinations according to the output signals. Therefore what is desired is to provide user interface that allows a user to change parameter edit screen layers easily and instinctively to a desired combination of characters, numbers, waveforms and channels and also provide easy learning of the operation of a signal generator.

SUMMARY OF THE INVENTION

The present invention improves operability of a signal generator that displays switchable parameter edit screen layers of different combinations of characters (including numbers), waveforms and channels. Screen layer indicators, such as tabs, are displayed on a display screen of a signal generator and shows different combinations of the characters, waveforms and channels of the corresponding parameter edit screen layers. The display of the screen layer indicators shows existence of parameter edit screen layers and one of the parameter edit screen layers is selected by selecting one of the screen layer indicators.

Character or waveform indicators are displayed on the screen layer indicators, which show combinations of characters, waveforms and channels of the corresponding parameter edit screen layers wherein the character or waveform indicators are dynamically changed according to selected channels or waveforms. Therefore a user can confirm outlines of the current settings of the respective channel output signals at a glance. The screen layer indicators may be selected by hardware buttons.

Another aspect of the present invention provides a method for displaying a parameter edit screen for a signal generator, which selectively displays parameter edit screen layers of different combinations of characters, waveforms and channels. Screen layer indicators, such as tabs, are displayed on a display screen and shows combinations of the characters, waveforms and channels of the respective parameter edit screen layers. The display of the screen layer indicators shows existence of the parameter edit screen layers. One of the parameter edit screen layers is selectively displayed by selecting one of the screen layer indicators.

A method according to the present invention displays character or waveform indicators on the screen layer indicators so that the screen layer indicators show combinations of characters, waveforms and channels, and are dynamically changed according to selected channels or waveforms. Therefore a user can easily realize current setting outlines of the respective channel output signals. The screen layer indicators and the corresponding parameter edit screen layers may be displayed continuously so that the user can easily realize which the screen layer indicators correspond to the parameter edit screen layers.

The objects, advantages and other novel features of the present invention are apparent from the following detailed description when read in conjunction with the appended claims and attached drawings.

DETAILED DESCRIPTION OF THE INVENTION

Figure 1:
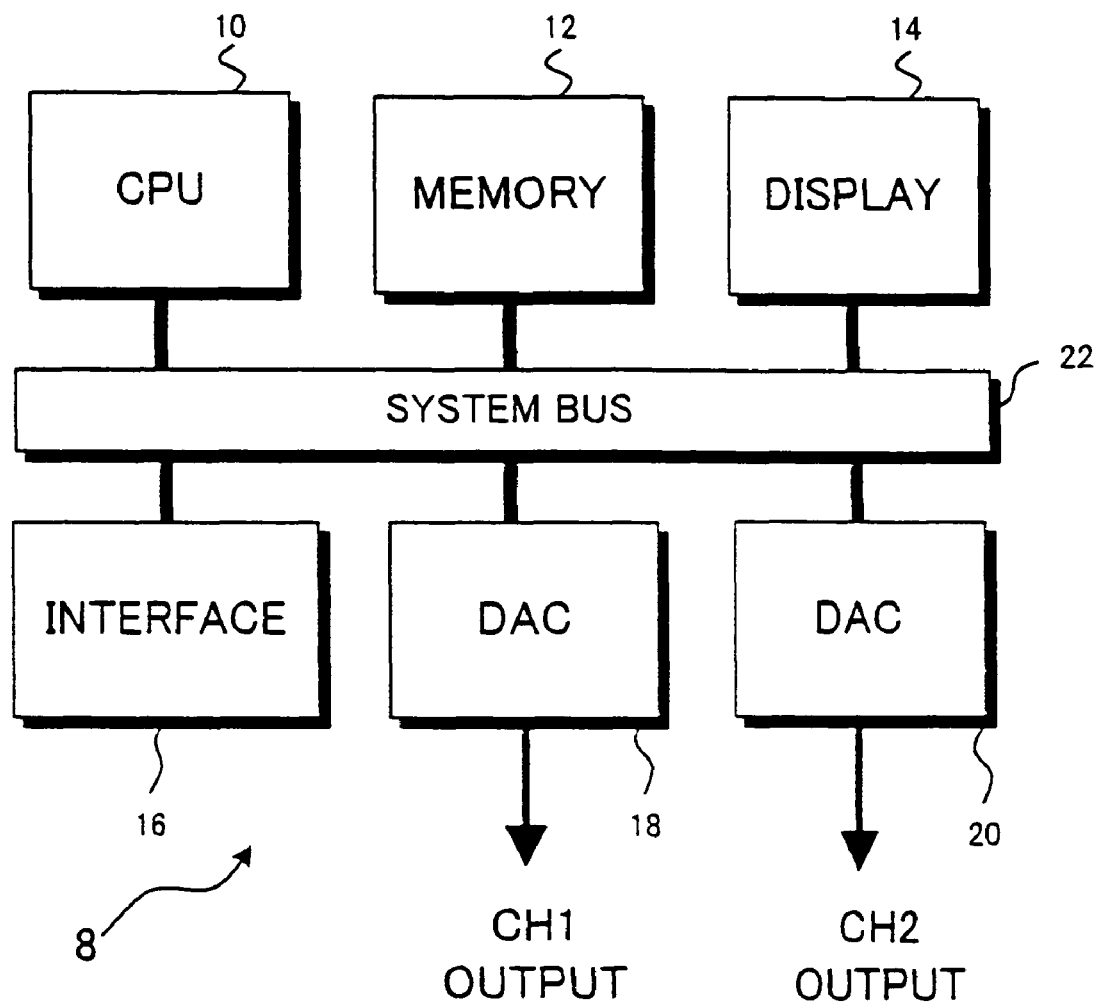
FIG. 1 is a schematic block diagram of a signal generator.

A basic hardware configuration of a signal generator according to the present invention is substantially the same as a conventional one shown in FIG. 1. The programs stored in the memory 12 implement the parameter edit screen functionality of the present invention.

Figure 2:
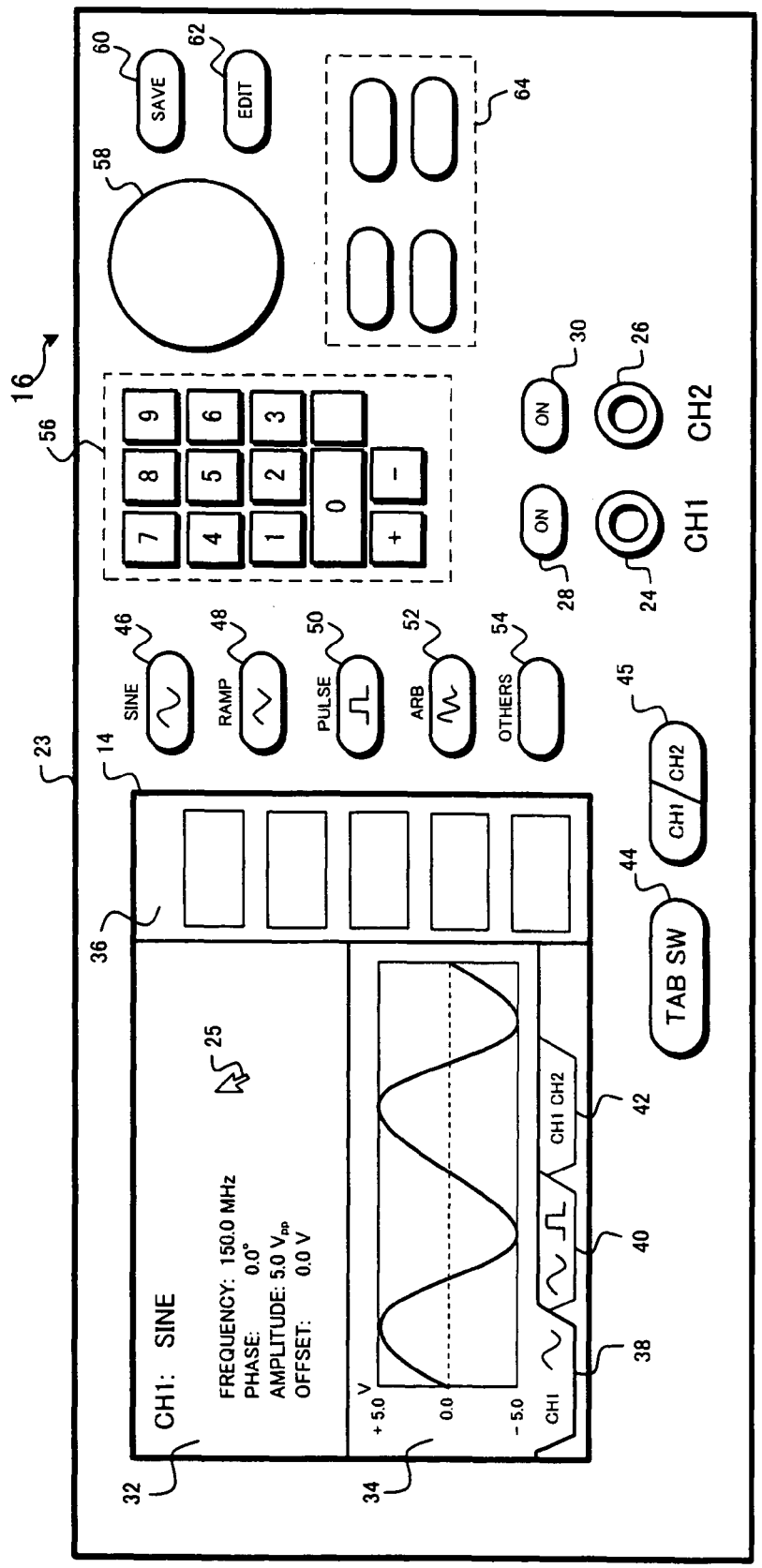
FIG. 2 is an example of a front panel of a signal generator suitable for the present invention showing a screen display for editing waveform parameters for a first channel.

FIG. 2 shows an example of a front panel 23 including display screen 14 and interface 16 suitable for the present invention. The interface 16 may include a pointing device, such as a mouse (not shown), that produces an icon 25 to indicate an arbitrary point on the display screen 14. The display screen 14 may be a touch panel that allows a user to use a pointing device or finger to indicate a desired point on the screen 14.

First and second channel output terminals 24 and 26 provide output electrical signals whose parameters are edited and set by a user. On/Off buttons 28 and 30 above the respective first and second channel output terminals 24 and 26 independently change the on or off status of the respective channel outputs.

The display screen 14 has three main display areas. The first and second display areas 32 and 34 provide characters including number or waveform graphs. The first and second display areas 32 and 34 consist of parameter edit screen layers, for example, three layers. First, second and third tabs 38, 40 and 42 are selected in turn by pressing a tab select button 44 to switch and display the respective parameter edit screen layers. A menu area 36 provides various menus for reading, saving and editing the waveform parameter data with cooperating operation buttons, rotary knob 58 and mouse, and for operating the signal generator.

All of the parameter edit screen layers are for waveform data parameter editing with the various layers having different combinations of the characters, numbers, waveforms and channels. The first tab 38 is a screen layer indicator that shows existence of the first parameter edit screen layer for editing and confirming waveform data parameters of an output signal for one channel by both characters and a waveform. In this example, there are two output channels and a channel select button 45 is pressed to make one of the channels editable, or active. The second tab 40 is a screen layer indicator that shows the existence of a second parameter-edit screen layer for editing and confirming waveform data parameters of two output signals for the two channels by displaying only waveforms. The third tab 42 is a screen layer indicator that shows existence of a third parameter edit screen layer for editing and confirming waveform data parameters of two output signal for the two channels by displaying characters including numbers.

Waveform data readout buttons 45, 46, 48, 50, 52 and 54 are for reading the existing waveform data, such as basic sine, ramp, pulse waveforms and the like, and waveform data previously created and stored by the user. The front panel 23 also has a numeric keypad (ten key) 56, rotary knob 58, save button 60 and edit button 62 for entering and editing waveform parameters in the waveform data edit mode. The front panel 23 may also include other operation buttons 64.

Figure 3:
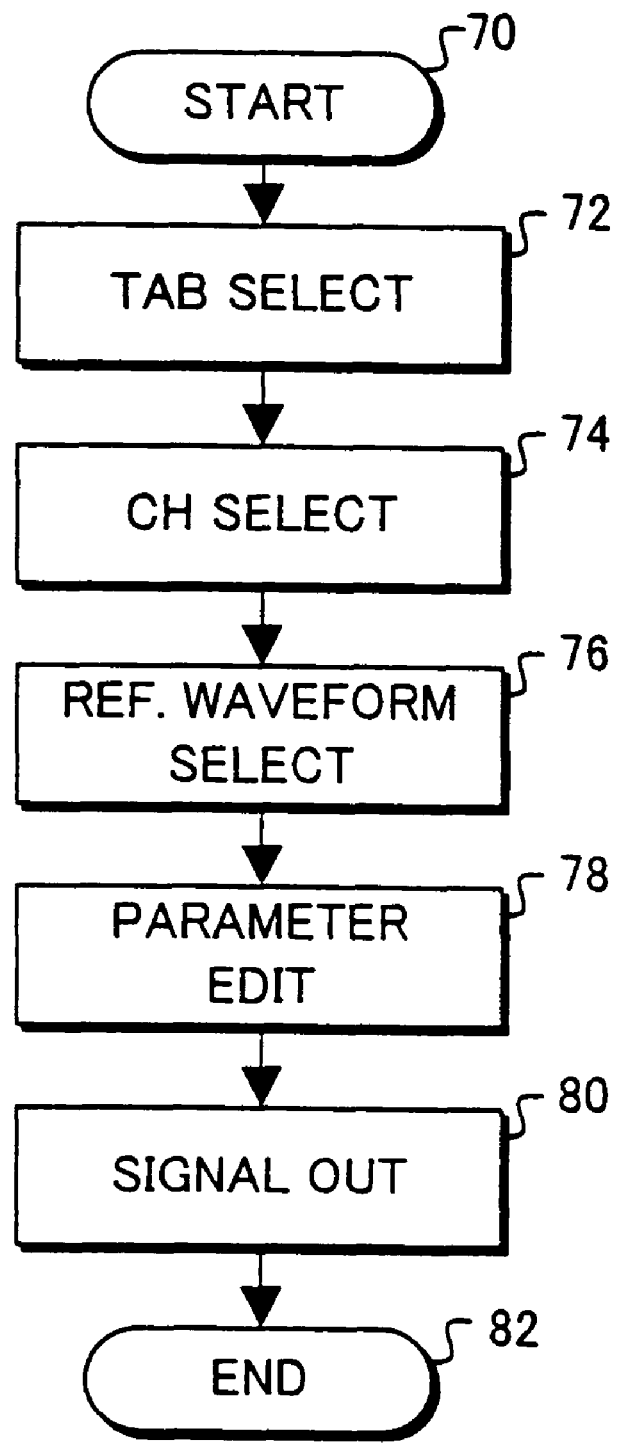
FIG. 3 is an example of a flowchart of waveform parameter editing of an output signal according to the present invention.

FIG. 3 is a representative flowchart of waveform parameter editing process. A user chooses a desired tab (such as the first tab 38) by the tab select button 44 (step 72). The user selects a channel by the channel select button 45, such as channel 1 in the display of FIG. 2 (step 74). The user uses the waveform data readout buttons 46, 48, 50 52 or 54 to read out the desired waveform data as a template, such as a sine wave in the display of FIG. 2. The order of the steps 72 76 may be modified at the user's choice. The parameters of the waveform data are modified or edited by the various buttons of the interface 16. In the case of a sine wave, frequency, phase and amplitude (peak to peak) are representative parameters. To avoid undesired data modification, the edit button 62 may be used to activate the edit mode.

One method of modifying the waveform parameters is to modify characters and numbers displayed in the first display area 32 using the interface 16 including the numeric keypad 56, the rotary knob, etc. Another method is to modify the waveform parameters using the interface 16 while observing the shape of the waveform in the second display area 34.

The edited waveform data or waveform data template may be stored in the memory 12 by pressing the save button 60. Pressing the CH 1 on/off button 28 to on, provides an electrical signal generated from the edited waveform data stored in memory 12 from the first channel (CH 1) output terminal 24.

The first tab 38 displays a representation of the waveform selected for one of the channels using the waveform data readout buttons 46, 48, 50, 52 or 54. The second tab 40 displays two waveforms (a sine wave and pulse in the example of FIG. 2) and the third tab 42 displays "CH 1" and "CH 2" characters. The order of the tabs 38, 40 and 42 and the display order of the two waveforms in the tab 40 indicates to the user that the left side waveform, or the sine wave, on the second tab 40 is the output signal for the first channel and the right side waveform, or pulse, is the output signal for the second channel. This means that waveforms on the first and second tabs 38 and 40 work as waveform indicators of the channels. The waveforms on the tabs are called "Waveform Indicators" hereinafter. What's important is that the waveform indicators on the first and second tabs 38 and 40 are dynamically changed according to the waveform data selected using the waveform data readout buttons 46, 48, 50, 52 or 54 for the respective channels.

Figure 4:
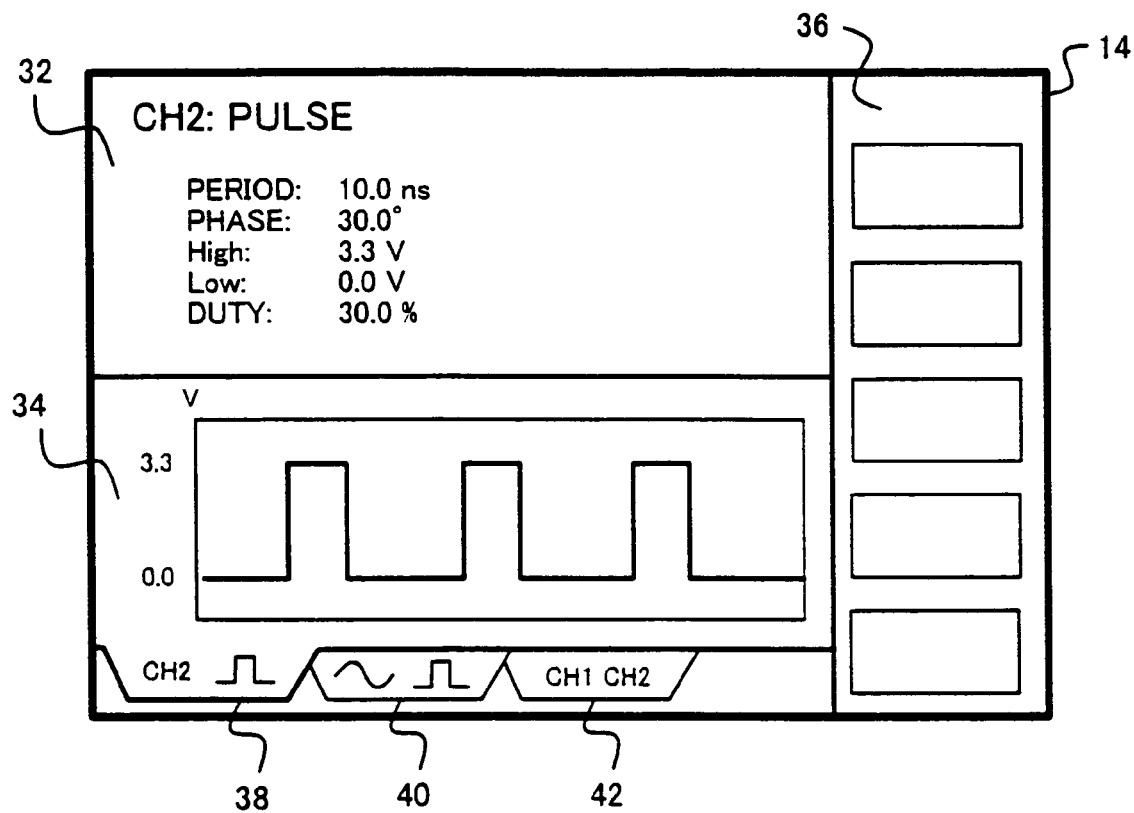
FIG. 4 is an example of a screen display for editing waveform parameters for a second channel.

FIG. 4 shows an example of the display screen 14 where the first tab 38 is selected and the channel select button 45 is pressed to make the second channel active in the parameter edit screen layer. This operation dynamically changes the displayed characters in the first tab 38 to "CH 2" and "a pulse waveform". The characters "CH 2" indicate that the second channel is in an editable status. The characters in the tab are called a "Character Indicator" hereinafter. As described, the character indicator changes according to the selected channel setting of the first parameter edit screen layer.

Figure 5:
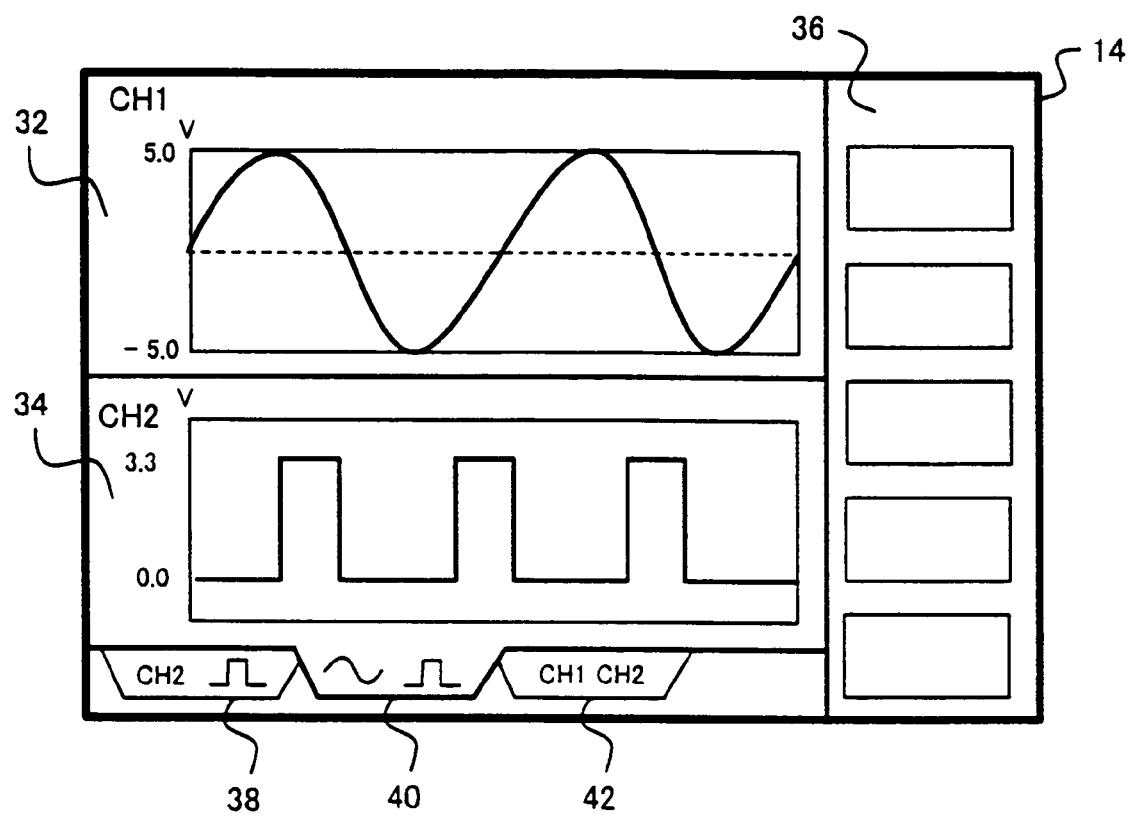
FIG. 5 is an example of a screen display for editing waveform parameters for waveforms on two channels.

FIG. 5 shows an example of the display screen 14 of the second parameter edit screen layer associated with tab 40 selected by pushing the tab select button 44. The first and second display areas 32 and 34 show waveform data for the output signals of the first and second channels respectively. This is suitable for considering timing between the waveform data for the output signals of the first and second channels while they are edited. When selecting between the first channel and second channels using the channel select button 45, the selected display area may increase the brightness or the background color may change, etc. to indicate which channel has entered into the editable status. Further, the waveforms may be directly edited through mouse or touch panel operation.

Figure 6:
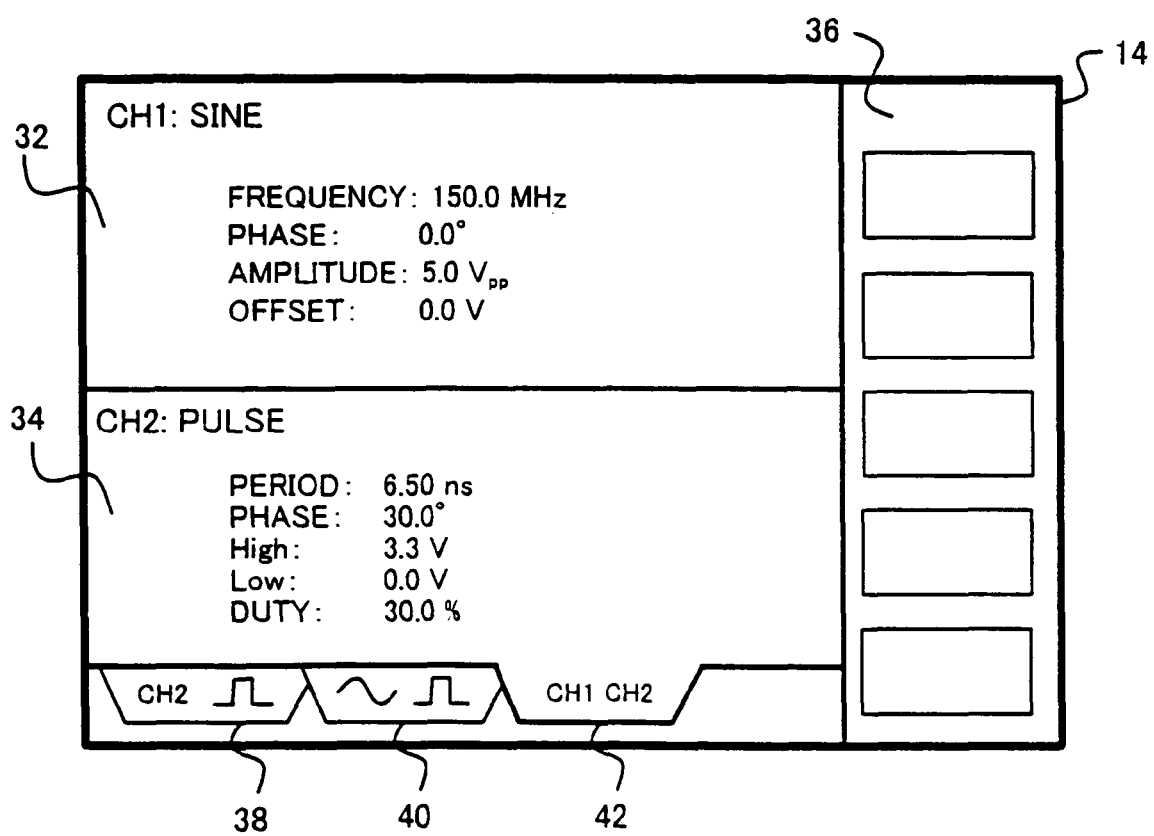
FIG. 6 is an example of a screen display for editing waveform parameters by characters and numbers on two channels.

FIG. 6 shows an example of the display screen 14 of the third parameter edit screen layer associated with the third tab 42 selected by pushing of the tab select button 44. This is suitable for designating the parameters of the waveform data for the output signals to both the channels by numbers. The first and second display areas 32 and 34 are used for designating the parameters of the waveform data for the output signals to the first and second channels by numerical values.

Figure 7:
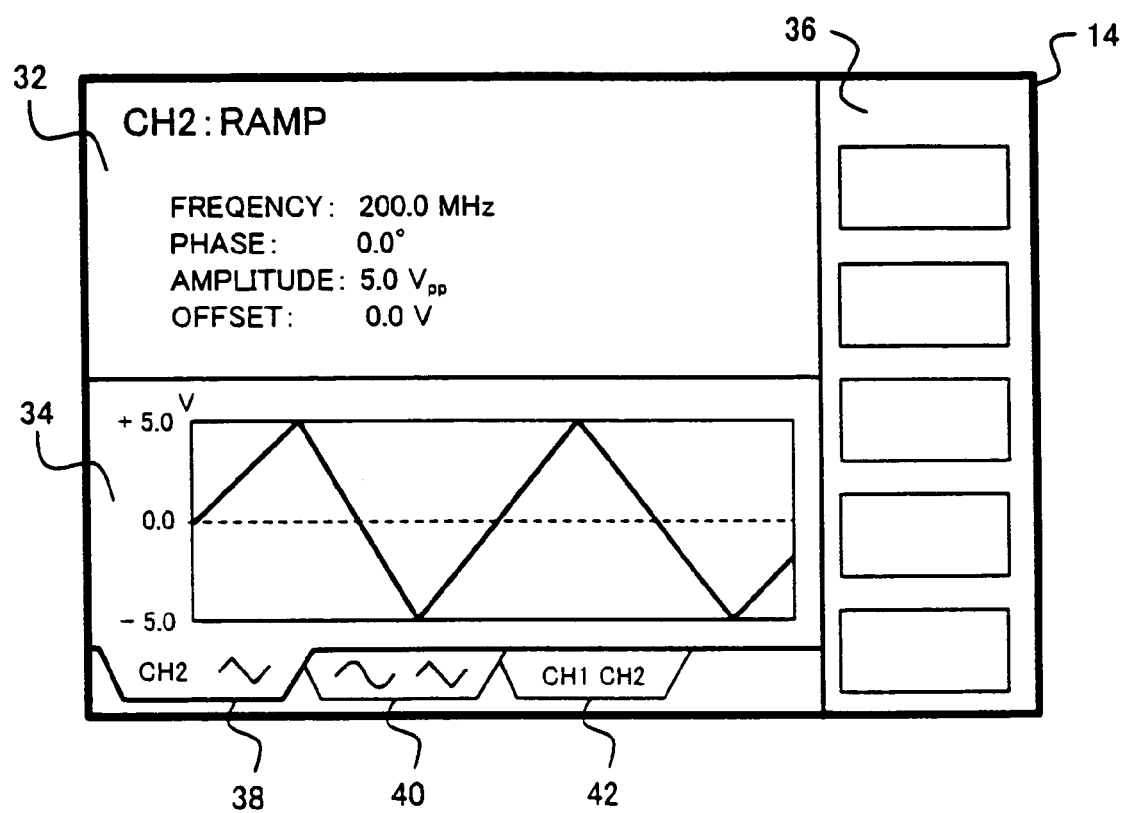
FIG. 7 is an example of a screen display for editing waveform parameters on the second channel having a different base waveform.

FIG. 7 shows an example of the display screen 14 of the first parameter edit screen layer associated with the first tab 38 selected by pushing of the tab select button 44 and the selection of the second channel by pushing the channel select button 45. In this case, ramp waveform data is read out as a reference waveform of the second channel instead of the former selected pulse waveform. As a result, the first tab 38 is changed to show characters "CH2" and "a ramp waveform" and the second tab 40 is changed to show a sine waveform of the first channel waveform to the left and a ramp waveform of the second channel waveform to the right. In this manner, tab appearances dynamically reflect changes of active channel and reference waveforms in the editable status. Note that the tabs are always displayed unlike the parameter edit screen layers so that the user can easily realize the setting outlines of the respective channels according to the display changes of the character and waveform indicators on the tabs.

The described embodiments show two channels but three or more channels may be similarly realized. The tabs, or the screen layer indicators, can be selected by mouse or touching a tab on the screen if a touch panel screen is used. The character and waveform indicators corresponding to an active channel in the editable status may change the color, intensity or be highlighted so that the active status is indicated. In other words, the tabs, or the screen layer indicators, are "active" tabs according to the settings.

As described the present invention provides tabs as indicators of parameter edit screen layers that provide different combinations of characters, numbers, waveforms and channels for editing waveform data for output signals of a signal generator. A user can easily selects desired edit mode combinations of characters, numbers, waveforms and channels for the waveform data of the output signals by selecting a desired tab. The character and waveform indicators on the tabs changes dynamically according to the setting changes of the waveform data and active channels so that the user can realize current setting outlines of the respective channels at a glance. This means that the user can change the setting of the parameters instinctively. The edit function of the present invention may be implemented independent of a signal generator. For example, it may be implemented as software for PC and the edited data is transferred to a signal generator.

What is claimed is:

1. A signal generator having output channels and a screen that selectively displays parameter edit screen layers of different combinations of characters and waveforms for selected output channels comprising a selectable screen layer indicator for each parameter edit screen layer with at least one screen layer indicator for one of the parameter edit screen layers having a waveform indicator displayed on the screen layer indicator representing a shape of a waveform signal output from that output channel, and another waveform indicator displayed on the screen layer indicator representing a shape of a waveform signal output from another output channel, and another screen layer indicator for another parameter edit screen layer having a character indicator displayed on the screen layer indicator representing one of the output channels and a waveform indicator displayed on the screen layer indicator representing a shape of a waveform signal output from the represented output channel of the character indicator wherein the selectable screen layer indicators are displayed at the same time to show the existence of the corresponding parameter edit screen layers and indicate the respective different combinations of character indicators and waveform indicators.

2. A signal generator recited in claim 1 wherein one of the parameter edit screen layers is displayed by selecting the corresponding screen layer indicator.

3. A signal generator recited in claim 1 wherein activating a different output channel of the signal generator using an output channel select button changes the character indicator displayed on the screen layer indicator of the other parameter edit screen layer to the activated output channel of the signal generator and changes at least one of intensity and color of the characters, waveforms and channels of the selectable parameter edit screen layers corresponding to the active output channel.

4. A signal generator recited in claim 1 wherein the screen layer indicators are displayed as tabs of the respective parameter edit screen layers.

5. A signal generator recited in claim 1 wherein the characters of the parameter edit screen layers includes numbers.

6. A signal generator having a plurality of output channels comprising:

means for displaying parameter edit screen layers wherein a first parameter edit screen layer is for editing parameters of a waveform for a first output channel of the plurality of output channels and the second parameter edit screen layer is for editing parameters of the waveform for the first output channel of the plurality of output channels and editing parameters of a second output channel of the plurality of output channels, and continuously displaying parts of the first and second parameter edit screen layers as respective first and second screen layer indicators wherein the first screen layer indicator has a character indicator representing the first output channel of the plurality of output channels and a waveform indicator representing a shape of the waveform for the first output channel of the plurality of output channels and the second screen layer indicator having waveform indicators representing the shapes of the waveforms for the respective first output channel and the second output channel of the plurality of output channels;

means for selecting one of the first and second screen layer indicators;

means for selecting one of the output channels of the plurality of output channels;

means for selecting a shape of the waveform for the selected output channel of the plurality of output channels;

means for editing the parameters of the waveform for the selected output channel of the plurality of output channels; and means for changing the shape of the waveform for the selected output channel of the plurality of output channels resulting in a corresponding change in the shape of the waveform of the waveform indicator of the first and second screen layer indicators corresponding to the selected output channel of the plurality of output channels.

7. A signal generator recited in claim 6 further comprising a third parameter edit screen layer for editing parameters of the waveforms for the first and second output channels of the plurality of output channels with characters, and the displaying means displays a part of the third parameter edit screen layer continuously as a third screen layer indicator having character indicators representing the respective first and second output channels of the plurality of output channels.

8. A signal generator recited in claim 7 wherein the third screen layer indicator is displayed as a tab of the third parameter edit screen layer.

9. A signal generator recited in claim 7 wherein the characters of the third parameter edit screen layer include numbers.

10. A signal generator recited in claim 6 wherein the character indicator and waveform indicator on the screen layer indicator of the first parameter edit screen layer, the waveform indicators on the screen layer indicator of the second parameter edit screen layer, and the character indicators on the screen layer indicator of the third parameter edit screen layer change intensity or color when selected.

11. A method for displaying selectable parameter edit screen layers wherein a first parameter edit screen layer is for editing parameters of a waveform for a first output channel of a plurality of output channels of a signal generator and the second parameter edit screen layer is for editing parameters of the waveform of the first output channel of the plurality of output channels and editing parameters of a second output channel of the plurality of output channels of the signal generator comprising the steps of:
- a) displaying one of the parameter edit screen layers, and displaying parts of the first and second parameter edit screen layers continuously as first and second screen layer indicators respectively wherein the first screen layer indicator has a character indicator representing the first output channel of the plurality of output channels of the signal generator and a waveform indicator representing a shape of the waveform for the first output channel of the plurality of output channels of the signal generator, and the second screen layer indicator has waveform indicators representing the shape of the waveforms for the respective first output channel and the second output channel of the plurality of output channels for the signal generator;
- b) selecting one of the first and second screen layer indicators;
- c) selecting one of the first and second output channels of the plurality of output channels;
- d) selecting a shape of the waveform for the selected output channel of the plurality of output channels;
- e) editing the parameters of the waveform for the selected output channel of the plurality of output channels; and
- f) changing the shape of the waveform for the selected output channel of the plurality of output channels resulting in a corresponding change in the shape of the waveform of the waveform indicator of the first and second screen layer indicators corresponding to the selected output channel of the plurality of output channels.

12. A method for displaying selectable parameter edit screen layers recited in claim 11 wherein the parameter edit screen layers further comprise displaying a third parameter edit screen layer for editing parameters of the waveforms for the respective first and second output channels of the plurality of output channels with characters, and a part of the third parameter edit screen layer is displayed continuously as a third screen layer indicator having character indicators representing the respective first and second output channels of the plurality of output channels in the displaying step of one of the parameter edit screen layers.

13. A method for displaying selectable parameter edit screen layers recited in claim 12 wherein the third screen layer indicator is displayed as a tab of the third parameter edit screen layer.

14. A method for displaying selectable parameter edit screen layers recited in claim 12 wherein the characters of the third parameter edit screen layer includes numbers.

15. A method for displaying parameter edit screen layers recited in claim 12 wherein the character indicator and waveform indicator on the screen layer indicator of the first parameter edit screen layer, the waveform indicators on the screen layer indicator of the second parameter edit screen layer, and the character indicators on the screen layer indicator of the third parameter edit screen layer change intensity or color when selected.

16. A method for displaying parameter edit screen layers recited in claim 15 wherein the screen layer indicators are displayed continuously with the respective parameter edit screen layers so that the corresponding relationships between the screen layer indicators and the parameter edit screen layers are visually displayed.

17. A method for displaying parameter edit screen layers recited in claim 11 wherein the screen layer indicators are displayed as tabs of the respective parameter edit screen layers.

18. A method for displaying parameter edit screen layers recited in claim 11 wherein the characters includes numbers.

* * * * *